(12) United States Patent
Böhm et al.

(10) Patent No.: US 6,452,852 B2
(45) Date of Patent: Sep. 17, 2002

(54) SEMICONDUCTOR MEMORY CONFIGURATION WITH A REFRESH LOGIC CIRCUIT, AND METHOD OF REFRESHING A MEMORY CONTENT OF THE SEMICONDUCTOR MEMORY CONFIGURATION

(75) Inventors: Thomas Böhm, Zorneding; Georg Braun, München, both of (DE); Heinz Hönigschmid, East Fishkill, NY (US); Thomas Röhr, Aschheim (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/767,380

(22) Filed: Jan. 22, 2001

(30) Foreign Application Priority Data

Jan. 20, 2000 (DE) .......................... 100 02 374

(51) Int. Cl.[7] .............................. G11C 7/00; G11C 11/22
(52) U.S. Cl. ........................................ 365/222; 365/145
(58) Field of Search .............................. 365/222, 145, 365/149, 189.07

(56) References Cited

U.S. PATENT DOCUMENTS

| 5,278,796 | A | | 1/1994 | Tillinghast et al. ......... 365/222 |
|---|---|---|---|---|
| 5,488,587 | A | * | 1/1996 | Fukumoto .................... 365/222 |
| 5,539,703 | A | | 7/1996 | Manning ..................... 365/149 |
| 5,652,729 | A | | 7/1997 | Iwata et al. ................. 365/222 |
| 5,969,981 | A | | 10/1999 | Kono ......................... 365/222 |
| 6,038,187 | A | | 3/2000 | Hajji ......................... 365/222 |
| 6,067,244 | A | * | 5/2000 | Ma et al. .................... 365/145 |
| 6,333,886 | B2 | * | 12/2001 | Cho et al. ................... 365/222 |

FOREIGN PATENT DOCUMENTS

| DE | 19830568 A1 | 10/1999 |
|---|---|---|
| FR | 2 775 382 A1 | 8/1999 |

OTHER PUBLICATIONS

"A 60ns 1Mb Nonvolatile Ferroelectric Memory with Non-Driven Cell Plate Line Write/Read Scheme", Hiroki Koike et al., IEEE International Solid State Circuits Conference, 1996, pp. 368 and 369.

* cited by examiner

Primary Examiner—Trong Phan
(74) Attorney, Agent, or Firm—Laurence A. Greenberg; Werner H. Stemer; Gregory L. Mayback

(57) ABSTRACT

In a semiconductor memory configuration, a refresh operation is always started by a refresh logic circuit when a comparison circuit determines that there is a specific minimum difference when comparing a characteristic variable of at least one reference memory cell with a reference value (VREF).

7 Claims, 2 Drawing Sheets

SEMICONDUCTOR MEMORY CONFIGURATION WITH A REFRESH LOGIC CIRCUIT, AND METHOD OF REFRESHING A MEMORY CONTENT OF THE SEMICONDUCTOR MEMORY CONFIGURATION

BACKGROUND OF THE INVENTION

Field of the Invention

The present invention relates to a semiconductor memory configuration having a memory cell field composed of a large number of memory cells. The memory cells are driven via word lines and bit lines. A refresh logic circuit for refreshing the memory content of the memory cells in the memory cell field is provided. The memory cells contain a capacitor and a transistor, which are connected in series between a terminal for a potential and a node point.

A memory configuration of this type is disclosed, for example, in the form of a ferroelectric memory configuration, by the publication by Hiroki Koike et al. Titled, "60 ns 1 Mb Nonvolatile Ferroelectric Memory with Non-Driven Cell Plate Line Write/Read Scheme", IEEE International Solid State Circuits Conference, pages 368 and 369, 1996. In order to be able to provide ferroelectric memory configurations with a high density, it is necessary to provide a common electrode for the storage capacitors and to keep the electrode at a constant potential. The constant potential is in particular formed by the arithmetic mean of the two voltages that are used on a bit line to write information into a memory cell. This concept is generally known as the "VDD/2 concept". The problem in the case of memory cells composed of one transistor and one ferroelectric capacitor (1T1C cells) and in the case of memory cells composed of two transistors and two ferroelectric capacitors (2T2C cells) is that when the VDD/2 concept is applied, leakage currents in the substrate, so-called sub-threshold currents, and leakage currents through the blocked pn junction are unavoidable. Furthermore, leakage currents through the capacitor dielectric occur, whose absolute values are mostly negligibly low and which preassume a voltage drop at the memory capacitor that is already considerable. The magnitude of the various leakage currents is subject to severe fluctuations as a result of production tolerances and the high temperature dependence of the leakage currents.

In order to limit this power demand, in the ferroelectric memory configuration according to Published, German Patent Application DE 198 30 568 A1, it is proposed that the bit line be subdivided into k segments, which form local bit lines, and that the local bit lines be connected to a global bit line via k switches.

Furthermore, corresponding refresh logic circuits are generally known in other semiconductor memory configurations, such as DRAMs or EPROMs, and likewise prevent stored information being lost. In the case of DRAMs, because of the leakage currents that occur, the contents of all the memory cells are read out at regular time intervals and written back again. In the case of EPROMs, a loss of information because of the impermissible shifting of the storage transistor threshold voltage can make continual refreshing of the memory contents necessary.

U.S. Pat. No. 5,278,796 describes a refresh control circuit for a DRAM, which supplies a temperature-dependent refresh cycle. A temperature sensor generates a temperature-dependent signal, which is compared in a comparator with a predefined reference voltage. The time period until the refresh cycle is next switched on is consequently controlled in a temperature-dependent manner.

U.S. Pat. No. 5,539,703 shows a DRAM having a refresh drive circuit. In order to match the refresh cycles to fluctuations in the manufacturing process, a capacitor within the oscillator controlling the refresh is designed to be comparable with one or more capacitors in the memory cells.

SUMMARY OF THE INVENTION

It is accordingly an object of the invention to provide a semiconductor memory configuration with a refresh logic circuit, and a method of refreshing a memory content of the semiconductor memory configuration which overcomes the above-mentioned disadvantages of the prior art devices and methods of this general type, in which the implementation of the refresh cycles are performed as beneficially as possible with regard to the necessary energy demand.

With the foregoing and other objects in view there is provided, in accordance with the invention, a semiconductor memory configuration. The memory configuration contains a terminal for connecting to a potential and a memory cell field having a number of memory cells and a node point. The memory cells each have a capacitor and a transistor connected in series between the terminal for the potential and the node point. Word lines are connected to and drive the memory cells, and bit lines are connected to the memory cells. A control circuit having a further node, a comparison circuit with an output, at least one memory cell and a refresh logic circuit connected to and refreshing a memory content of the memory cells in the memory cell field, is provided. The at least one memory cell of the control circuit contains a capacitor and a transistor connected in series between the terminal for the potential and the further node. The further node of the control circuit is connected to the comparison circuit, and the output of the comparison circuit controls the refresh logic circuit to cause the memory cells in the memory cell field to be refreshed.

According to the invention, in the semiconductor memory configuration and in the method of refreshing the memory content of the semiconductor memory configuration, with the aid of a comparison circuit, a characteristic variable of at least one reference memory cell is compared with a reference value and, if required, a refresh logic circuit is activated. The refresh operation in the memory cell field of the memory configuration is therefore not started in each case at rigid time intervals predefined by an internal timer circuit but is carried out only when it is actually needed. The refresh cycle is in this case triggered on the basis of the electrical state of the memory cells. In particular, no energy is wasted for unnecessary refresh cycles, which is very important in the case of the particularly low energy consumption required for mobile applications.

Advantageously, the memory configuration has specific reference memory cells, whose characteristic variables are evaluated by the comparison circuit in order to be able to control the refresh operation as required. These separate reference memory cells can be connected up to the comparison circuit in a simple way. Alternatively, it is also possible that, for example, memory cells in the memory cell field which have been shown to be particularly bad in the storage function test, or those particularly affected by leakage currents, are defined as reference measurement cells and used when operating the semiconductor memory. During the production and selection of the reference memory cells, care must be taken that, in terms of process engineering and the environmental conditions which influence them, in particular the operating temperature, these should correspond as far as possible to the memory cells to be refreshed.

In accordance with an added feature of the invention, the at least one memory cell of the control circuit has a storage node, and the comparison circuit is a differential amplifier which compares a potential of the storage node of the at least one memory cell of the control circuit with a reference voltage.

In accordance with an additional feature of the invention, the at least one memory cell of the control circuit is one of a plurality of reference memory cells whose characteristic variables are evaluated by the comparison circuit. And the refresh logic circuit refreshes both the memory content of the memory cells in the memory cell field and a memory content of the reference memory cells.

In accordance with another feature of the invention, the reference memory cells of the control circuit and the memory cells of the memory cell field are ferroelectric memory cells.

In accordance with a further feature of the invention, an input capacitance of the comparison circuit is negligibly small compared to a capacitance of the reference memory cells.

With the foregoing and other objects in view there is also provided, in accordance with the invention, a method of refreshing a memory content of memory cells in a memory cell field of a semiconductor memory configuration. The method includes the steps of comparing an output signal of at least one further memory cell with a reference value; and starting a refresh cycle each time there is an impermissibly large difference between the output signal and the reference value for refreshing the memory cells of the memory cell field.

In accordance with a concomitant mode of the invention, there is the step of refreshing a content of the further memory cell if there is an impermissibly large difference between the output signal and the reference value.

Other features which are considered as characteristic for the invention are set forth in the appended claims.

Although the invention is illustrated and described herein as embodied in a semiconductor memory configuration with a refresh logic circuit, and a method of refreshing a memory content of the semiconductor memory configuration, it is nevertheless not intended to be limited to the details shown, since various modifications and structural changes may be made therein without departing from the spirit of the invention and within the scope and range of equivalents of the claims.

The construction and method of operation of the invention, however, together with-additional objects and advantages thereof will be best understood from the following description of specific embodiments when read in connection with the accompanying drawings.

DESCRIPTION OF THE PREFERRED EMBODIMENTS

Figure 1:
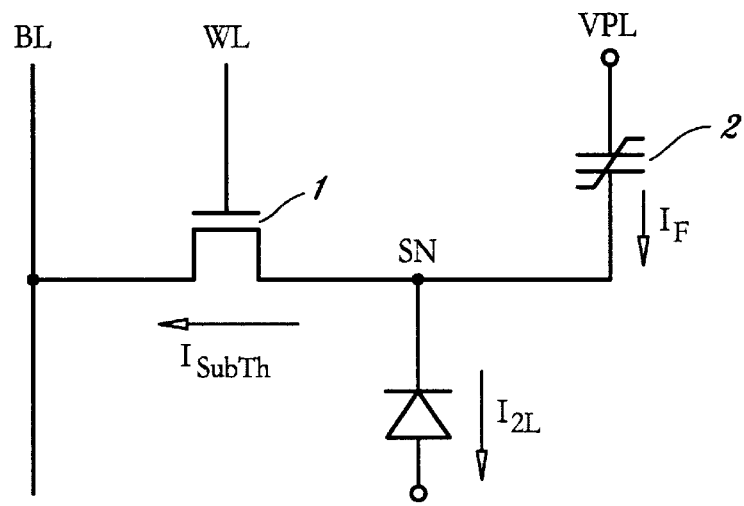
FIG. 1 is a circuit diagram of a prior art ferroelectric memory cell with defined leakage currents.

In all the figures of the drawing, sub-features and integral parts that correspond to one another bear the same reference symbol in each case. Referring now to the figures of the drawing in detail and first, particularly, to FIG. 1 thereof, there is shown a known memory cell having a bit line BL, a word line WL, a selection transistor 1, a storage capacitor 2, whose one electrode is kept at a constant potential VPL together with other corresponding electrodes of the storage capacitors of further memory cells, and a memory node SN. The sub-threshold current $I_{SubTh}$ between a source and a drain of the selection transistor 1, a leakage current $I_{JL}$ of a blocked pn junction via a corresponding diode to a substrate, and a leakage current $I_F$ through a capacitor dielectric are in each case illustrated by an appropriate arrow. The sub-threshold current $I_{SubTh}$ can be compensated for by the bit line BL, when in the standby mode, being kept at the same potential as the common electrode, that is to say at the potential VPL.

Figure 2:
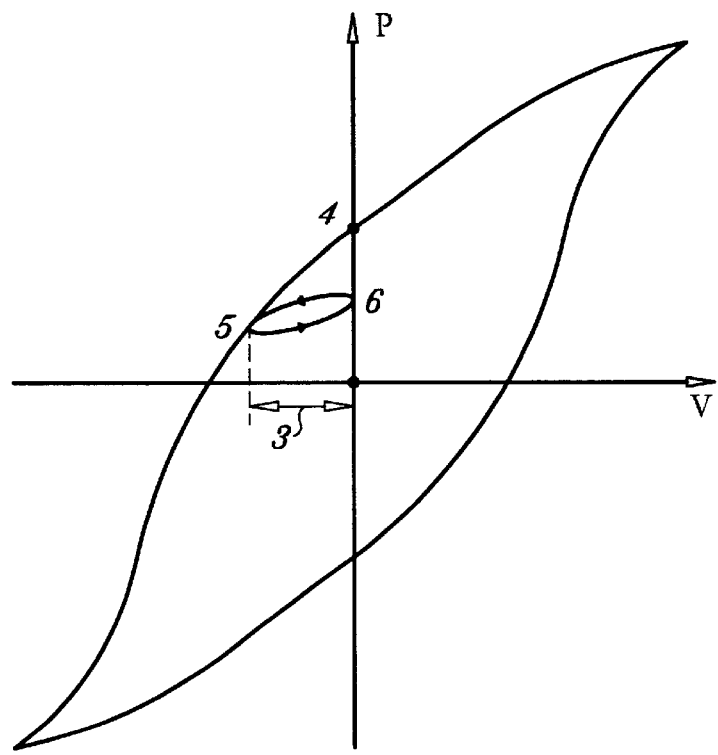
FIG. 2 is a graph of a hysteresis curve for a ferroelectric storage capacitor.

A greater problem in comparison with the sub-threshold current is the leakage current $I_{JL}$ via the blocked pn junction. In order to overcome the problems associated with the leakage current $I_{JL}$, there were previously two approaches to a solution. Both were based on the fact that the charge which flows away through the blocked pn junction is topped up, either continuously or cyclically, by the selection transistor 1 of the memory cell (in this respect, see also the reference specified above by Hiroki Koike). However, switching on the selection transistor 1 cyclically has the disadvantage that, as a result of the leakage current $I_{JL}$ between the refresh cycles, interfering pulses occur on the storage capacitor 2, and at most an amplitude of the pulses can be limited. However, such a procedure is difficult, since the leakage in current $I_{JL}$ of the blocked pn junction is not only subject to severe fluctuations but also rises considerably with temperature. In relation to the interfering pulses and their effects on the storage capacitor 2, reference should be made to FIG. 2, in which a hysteresis curve of the ferroelectric storage capacitor 2 is plotted. The hysteresis curve shows that, for example in the case of a voltage V=0 across the capacitor 2, there are two polarization states P which represent the stored information. If, for example as a result of an interfering pulse 3 caused by the leakage current $I_{JL}$, the polarization P wanders from a point 4 to a point 5, and if, after the interfering pulse 3 has decayed again, the voltage V=0 is again present across the storage capacitor 2, then the polarization does not return to the point 4 but instead wanders to a point 6, which is placed below the point 4. A plurality of interfering pulses 3 can in this way have the effect that ultimately the information or polarization stored in the capacitor 2 is lost.

On the other hand, switching on the selection transistor 1 continually in order to protect the memory content, as distinct from switching on cyclically, is only possible if no access is made to the memory configuration. If an access is made, then only the relevant word line of the memory cell field is permitted to be active, while all the other word lines must be switched off. Switching off in this way is not a problem in itself. Following the memory access, however, in order to compensate for the leakage currents or in order to refresh the memory contents, all the word lines have to be switched on again, which, as a result of the high capacitive load on all the word lines as a whole, has the effect of a large rise in the power demand of the memory configuration.

Figure 3:
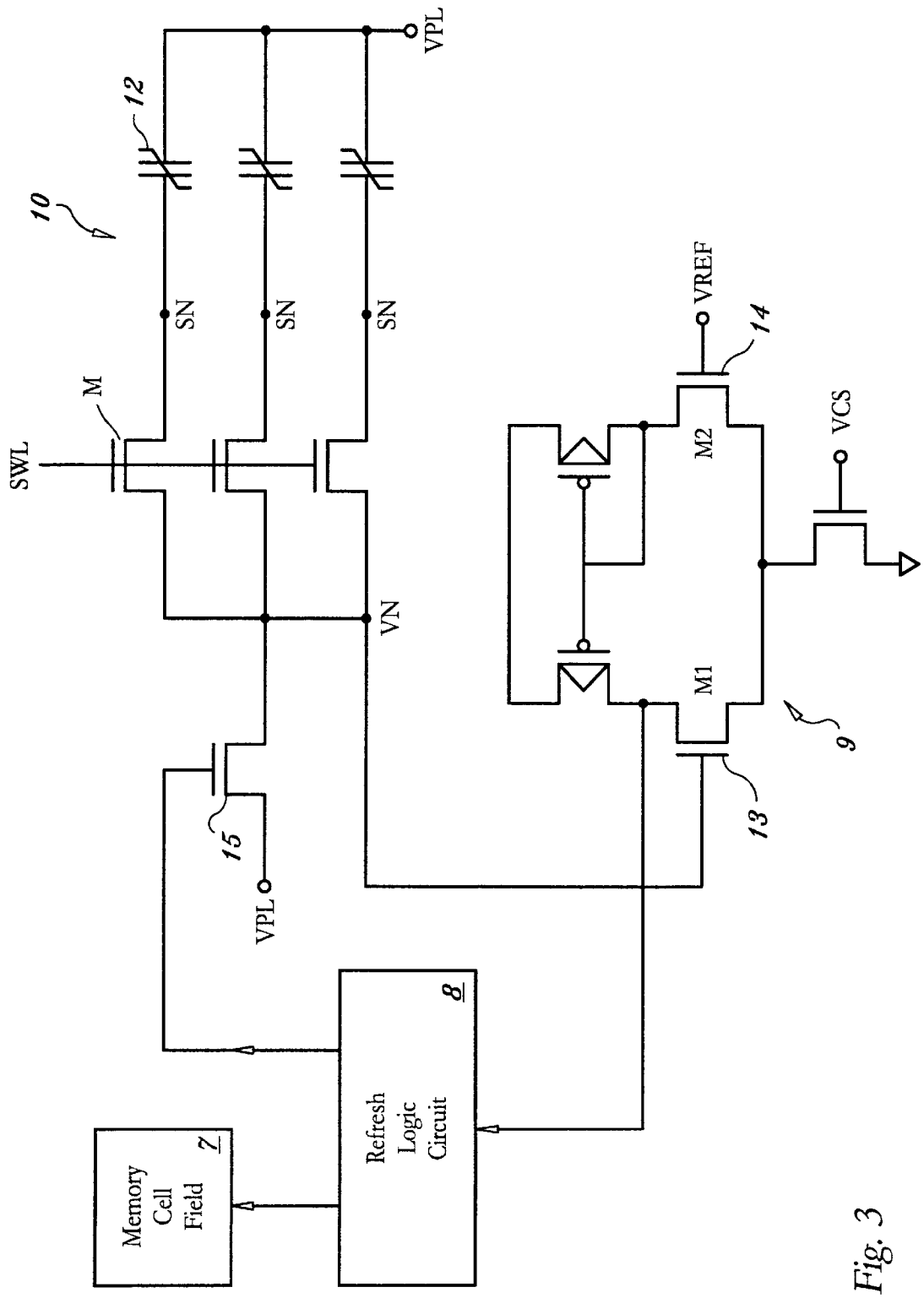
FIG. 3 is a simplified circuit diagram of the ferroelectric memory configuration according to the invention.

In FIG. 3, there is shown according to the invention, a solution to this problem. FIG. 3 shows a ferroelectric memory configuration having a memory cell field 7, a refresh logic circuit 8, a comparison circuit 9 and a reference memory cell field 10. In the memory cell field 7, which is not specifically illustrated but is generally known (see FIG. 1), the common electrodes of the ferroelectric storage capacitors of memory cells are kept, according to FIG. 1, at the potential VPL which is typically 1.25 V, it being true that VPL=VDD/2. By the application of voltages which are greater or smaller than VPL to the other electrode of the storage capacitor 2 via the bit line BL, and by switching on the selection transistor 1 via the word line WL, a desired polarization state is produced in the dielectric of the storage capacitor 2, and therefore the information is stored in the ferroelectric memory cell (FIG. 1). The refresh logic circuit 8 can be, for example, a circuit known from dynamic random access memory (DRAM) technology or the configurations described in the reference by Hiroki Koike indicated above. The reference memory cell field 10 contains, for example, three parallel-connected ferroelectric memory cells, which each have a reference selection transistor 11 and a ferroelectric reference storage capacitor 12. The three memory cells are driven by a control word line SWL belonging to the refresh logic circuit 8. Alternatively, there is also the possibility of using a plurality of control word lines SWL, for example three thereof, to drive the three memory cells.

One electrode of the reference storage capacitors 12 is kept at the constant potential VPL, which is equal to the common potential of the storage capacitors 2 of the memory cell field 7 (FIG. 1). The other electrode of the reference storage capacitor 12 in each case represents the storage node SN of the reference memory cell and is connected, for example, to a drain of the respective reference selection transistor 11. Sources of the reference selection transistors 11 are jointly connected to a comparison storage node VN, which is connected to a gate of an input transistor 13 of a differential amplifier which is known per se and used as the comparison circuit 9. In this case, in order to avoid measurement errors, care must be taken that an input capacitance of the differential amplifier 9 is chosen to be small by comparison with a capacitance of the reference measurement cells 10. The differential amplifier 9 in each case compares the potential at one of the storage nodes SN or at the comparison storage node VN with a reference voltage VREF applied to a gate of a second input transistor 14 of the differential amplifier 9. For this voltage, it is for example true that VREF=VPL-0.1 V. Here, the voltage value is chosen on the basis, first, of the desired data security of the memory content of the memory cell field 7 and, second, of the desired low energy consumption arising from the refresh operation. Alternatively, provision could also be made to set VREF=VPL and to dimension the input transistors 13, 14 of the differential amplifier 9 asymmetrically. In this way, an offset voltage is produced in the differential amplifier 9, and performs the same function as the differential voltage of 100 mV specified above. The comparison circuit 9 can be configured in such a way that only an upward or downward violation of a suitable reference value is evaluated, or that both deviations are registered and trigger a refresh operation.

An output of the differential amplifier 9 is connected to the refresh logic circuit 8, which initiates the refresh operation for the memory cell field 7 of the ferroelectric semiconductor memory as required. In addition, the refresh logic circuit 8 drives a leakage current compensation circuit having the leakage current compensation transistor 15. The circuit 8 switches the transistor 15 on briefly and, as a result activates a write circuit for the reference memory cells 10, so that at the same time as the content of the memory cell field 7 is refreshed, the desired voltage VPL on the three storage nodes SN of the reference storage capacitors 12 is established again. For this purpose, the gate of the leakage current compensation transistor 15 and the control word line SWL of the reference memory cells 10 are connected to corresponding outputs of the refresh logic circuit 8.

The functioning of the ferroelectric memory configuration according to FIG. 3 is as follows. At the start, via the control word line SWL, the three reference selection transistors 11 and the leakage current compensation transistor 15 are switched on. As a result, the potentials in the three storage nodes SN of the three reference storage capacitors 12 are set to the value VPL, and therefore the voltage dropped across the ferroelectric capacitor is reduced to 0 V. The leakage current compensation transistor 15 is then switched off again. During the operation of the ferroelectric memory configuration, the leakage currents described above may cause changes, differing from one another, in the potentials of the three storage nodes SN in the reference memory cells 10, and corresponding, undesired changes in the potentials in the memory cells in the memory cell field 7. The potentials of the three storage nodes SN of the reference memory cells 10 are compared one after another with the reference value VREF by the respective reference selection transistor 11 and the differential amplifier 9. Here, the reference selection transistors 11 can be switched on permanently or else switched on periodically by the differential amplifier 9 for the comparison measurement.

As soon as the deviation at one of these three storage nodes is greater than is permissible, the refresh logic circuit 8 starts a refresh operation. In the process, in a manner known per se, the content of the memory cells of the memory cell field 7 is refreshed. In addition, the charge losses caused by the leakage currents in the reference memory cells 10 are compensated for, and the potentials of the three reference storage nodes SN are set to the initial value VPL again. The differential amplifier 9 continues the above-described voltage comparison.

The invention can be used in all semiconductor memory types in which it is necessary to refresh the memory content, in particular in DRAMs, EPROMs and Flash memories. The features of the invention disclosed in the above description, the drawing and the claims may be important both individually and also in any desired combination for the implementation of the invention in its various configurations.

We claim:

1. A semiconductor memory configuration, comprising:
a terminal for connecting to a potential;
a memory cell field containing a number of memory cells and a node point, said memory cells each having a capacitor and a transistor connected in series between said terminal for the potential and said node point;
word lines connected to and driving said memory cells;
bit lines connected to said memory cells; and
a control circuit having a further node, a comparison circuit with an output, at least one memory cell and a refresh logic circuit connected to and refreshing a memory content of said memory cells in said memory cell field, said at least one memory cell of said control circuit contains a capacitor and a transistor connected in series between said terminal for the potential and said further node, said further node of said control circuit is connected to said comparison circuit, and said output of said comparison circuit controls said refresh logic circuit to cause said memory cells in said memory cell field to be refreshed.

2. The semiconductor memory configuration according to claim 1, wherein said at least one memory cell of said control circuit has a storage node, and said comparison circuit is a differential amplifier which compares a potential of said storage node of said at least one memory cell of said control circuit with a reference voltage.

3. The semiconductor memory configuration according to claim 1, wherein said at least one memory cell of said control circuit is one of a plurality of reference memory cells whose characteristic variables are evaluated by said comparison circuit, and said refresh logic circuit refreshes both the memory content of said memory cells in said memory cell field and a memory content of said reference memory cells.

4. The semiconductor memory configuration according to claim 3, wherein said reference memory cells of said control circuit and said memory cells of said memory cell field are ferroelectric memory cells.

5. The semiconductor memory configuration according to claim 3, wherein an input capacitance of said comparison circuit is negligibly small compared to a capacitance of said reference memory cells.

6. A method of refreshing a memory content of memory cells in a memory cell field of a semiconductor memory configuration, which comprises the steps of:

comparing an output signal of at least one further memory cell with a reference value and starting a refresh cycle each time there is an impermissibly large difference between the output signal and the reference value for refreshing the memory cells of the memory cell field.

7. The method according to claim 6, which comprises refreshing a content of the further memory cell if there is an impermissibly large difference between the output signal and the reference value.

* * * * *